US 6,553,544 B2

(12) United States Patent
Tanaka et al.

(10) Patent No.: US 6,553,544 B2
(45) Date of Patent: Apr. 22, 2003

(54) METHOD FOR DESIGN OF PARTIAL CIRCUIT

(75) Inventors: Masakazu Tanaka, Kyotanabe (JP); Masahiro Fukui, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/816,063

(22) Filed: Mar. 26, 2001

(65) Prior Publication Data

US 2001/0027553 A1 Oct. 4, 2001

(30) Foreign Application Priority Data

Apr. 4, 2000 (JP) ........................................ 2000-102237

(51) Int. Cl.⁷ .............................................. G06F 17/50
(52) U.S. Cl. .................. 716/3; 716/8; 716/12
(58) Field of Search ........................ 716/2, 3, 1, 4–18

(56) References Cited

U.S. PATENT DOCUMENTS

| | | | | |
|---|---|---|---|---|
| 5,278,769 A | * | 1/1994 | Bair et al. .................. | 364/490 |
| 5,333,032 A | * | 7/1994 | Matsumoto et al. ........ | 364/489 |
| 5,416,720 A | * | 5/1995 | Fukui ......................... | 364/489 |
| 5,572,436 A | * | 11/1996 | Dangelo et al. ............ | 364/489 |
| 5,602,753 A | * | 2/1997 | Fukui ......................... | 364/459 |
| 5,903,470 A | * | 5/1999 | Miyoshi et al. ............. | 364/489 |
| 5,978,572 A | * | 11/1999 | Toyonaga et al. ....... | 395/500.06 |
| 6,169,968 B1 | * | 1/2001 | Kabuo ......................... | 703/14 |
| 6,253,351 B1 | * | 6/2001 | Fukui et al. ................. | 716/2 |

FOREIGN PATENT DOCUMENTS

JP          2872990          1/1999

* cited by examiner

Primary Examiner—Tuan T. Lam
Assistant Examiner—Hai L. Nguyen
(74) Attorney, Agent, or Firm—Stevens, Davis, Miller & Mosher, LLP (57) ABSTRACT

There is no conventional method for precisely estimating under what external conditions each partial circuit, such as a library cell, is utilized in an actual integrated circuit at the time of designing the partial circuit. Therefore, by estimating the external conditions of a partial circuit when used in an integrated circuit so that the partial circuit is designed in accordance with the external conditions, the partial circuit having optimal performance for the external conditions can be designed. The step of external condition estimation can be formed so as to include the technology conversion step which technologically converts the layout for external condition extraction, that is prepared in advance, based on the technology information of an integrated circuit, which is the design objective; the layout extraction step of extracting layout extraction information which is external information influencing the operation of the partial circuit from the layout for external condition extraction that has been technologically converted; and the external condition calculation step of calculating external conditions of the partial circuit from the layout extraction information. In addition, by simply replacing the designed partial circuit with a partial circuit of a circuit for evaluation, the evaluation of the designed partial circuit can be easily carried out.

18 Claims, 5 Drawing Sheets

METHOD FOR DESIGN OF PARTIAL CIRCUIT

BACKGROUND OF THE INVENTION

1. Field of the Invention

The present invention relates to a method of design for a partial circuit of a library cell, such as an AND circuit, a NAND circuit and an inverter circuit, of a reusable IP (intellectual property), such as an operational amplifier, an AD converter, a 32 bit multiplier and a CPU, and of the like, which are utilized in an integrated circuit such as an LSI.

2. Prior Art

It is general for a library design in an integrated circuit to be carried out by reusing circuit information and layout information of a library cell in the preceding process in order to shorten the number of design steps based on process technology information. As for a conventional method of design, there is a method for reducing the scale of the transistor size, or the like, used in the preceding process technology in a constant proportion by using a proportional constant in accordance with the change of the design rules, such as for the wire width. On the other hand, as for a method for optimizing the circuit performance, there is a method for optimizing the transistor size based on a design index, such as minimizing the delay, as disclosed in the Japanese patent 2872990.

In order to achieve the improvement of the performance or the reduction of the area of an integrated circuit, it is necessary for the individual library cells which form the integrated circuit to be optimized in performance and in area. A library cell, however, has different characteristics in accordance with the utilization conditions in the actual integrated circuit. Therefore, in designing a library cell it is necessary to carry out the optimization of the library cell under utilization conditions that are closer to those of the actual integrated circuit.

In a conventional method for design of a library cell, however, there is no method for precisely estimating, at the time of designing the library cell, under what conditions each of the library cells will be utilized in the actual integrated circuit. Therefore, the integrated circuit, which is formed of those library cells, has a problem such that sufficient operational speed cannot be gained or costs for extra area or power consumption are increased in order to secure the operational speed.

In addition, external conditions, such as the output load capacitance or the drive resistance of the input signal, at the time individual library cells included in the library are utilized in the integrated circuit, which is the design objective, are not unitarily determined for the technology but, rather, differ greatly due to the scale of the circuit, which is the design objective, or the types of circuit. Furthermore, even concerning the same circuit scale and type, since the same library cells are normally utilized in a variety of places in an integrated circuit, there is the problem that the external conditions cannot be precisely estimated at the time of designing the library cell.

In addition, at the time of design, trade offs of a variety of design indices, such as delay, area, power consumption and withstand against noise, exist and there is the problem that there is no method for the optimization of this plurality of indices from the viewpoint of trade offs.

In addition, in designing an IP which is a reusable macro block such as an operational amplifier, an AD converter, a 32 bit multiplier and a CPU, there is a case of design for utilization in other external conditions, such as ones where an IP which is a part of an already designed circuit (partial circuit) is utilized for a different technology, and a case of design with a presupposition, from the start, of the utilization under a plurality of external conditions. Accordingly, in the case of an IP, in the same manner as in the library cells, design is carried out under different external conditions or at a stage where the external conditions for this time are not seen and, therefore, there is the problem that the IP cannot be said to have optimal performance.

SUMMARY OF THE INVENTION

The purpose of the present invention is to provide a method for design of a partial circuit which can design a partial circuit, such as a library cell or an IP, so as to suitable for the external conditions at the time of the actual utilization on an integrated circuit.

A method for design of a partial circuit according to the present invention is a method for designing a partial circuit which designs a partial circuit of an integrated circuit characterized by including the step of external condition estimation, which estimates the external conditions of a partial circuit at the time of usage on an integrated circuit and the optimization step for designing the partial circuit according to the external conditions.

The step of external condition estimation is provided in this configuration and a partial circuit is designed according to the external conditions so that a partial circuit of which the performance is optimal for the external conditions can be designed.

In addition, in the present invention, the step of external condition estimation estimates the external conditions of a partial circuit based on technology information of an integrated circuit which is the design objective.

In addition, in the present invention, the step of external condition estimation includes the step of technology conversion which technologically converts the layout for external condition extraction which is prepared in advance based on technology information of an integrated circuit which is design objective, the step of layout extraction which extracts layout extraction information, that is external information which influences the operation of the partial circuit, from the layout for external condition extraction which has been technologically converted and the step of external condition calculation which calculates the external conditions of the partial circuit from the layout extraction information.

In this configuration, since the step of external condition estimation comprises the step of technology conversion, the step of layout extraction and the step of external condition calculation, it becomes possible to easily and precisely estimate the external conditions of a partial circuit in the technology, which is the design objective. In this case, the layout for external condition extraction, which has been prepared in advance, may include one, or more, partial circuits, which are the design objective, and may comprise arrangement information and wiring information of the partial circuits. In addition, the technology information of the integrated circuit, which is the design objective, may include one, or more, pieces of information from among information of the wire width, the minimum size of transistors and the wire gap.

In addition, the layout for external condition extraction which has been technologically converted in the step of technology conversion may be provided with the step of wiring which carries out rewiring based on the technology information of the integrated circuit, which is the design objective, so that in the step of layout extraction, the layout extraction information may be extracted from the layout for external condition extraction wherein rewiring is carried out in the step of wiring. In this case, since the step of wiring, which carries out rewiring, is provided, the value of the wire length, or the like, can be made closer to the value in the actual integrated circuit so that more precise external conditions can be easily estimated.

In addition, the layout for external condition extraction which has been technologically converted in the step of technology conversion may be provided with the step of compaction which carries out compaction so that in the step of layout extraction, the layout extraction information may be extracted from the layout for external condition extraction wherein compaction is carried out in the step of compaction. In this case, said the step of compaction is provided, the value of the wire length, or the like, can be made closer to the value in the actual integrated circuit so that more precise external conditions can be easily estimated.

In addition, the layout for external condition extraction which has been technologically converted in the step of technology conversion may be provided with the step of wiring which carries out rewiring based on the technology information of the integrated circuit, which is the design objective and, at the same time, may be provided with the step of compaction which carries out compaction for the layout for external condition extraction where rewiring has been carried out in the step of wiring so that in the step of layout extraction, layout extraction information may be extracted from the layout for external condition extraction wherein compaction has been in the step of compaction. In this case, since both the step of wiring, which carries out rewiring, and the step of compaction, the value of the wire length, or the like, can be made additionally closer to the value in the actual integrated circuit in comparison with the case where only one of them is provided so that more precise external conditions can be easily estimated.

In addition, in the present invention, the step of external condition estimation may estimate different external conditions in two, or more, partial circuits while the step of optimization may design each partial circuit under different external conditions in accordance with the partial circuit. In this case, since different external conditions are found for each partial circuit and each partial circuit is designed in accordance with the respective external conditions, the external conditions of a partial circuit can be more precisely estimated so that a partial circuit of high performance can be designed.

In addition, in the present invention, the step of external condition estimation may estimate external conditions in accordance with two, or more, integrated circuit, which become the design objectives, and the step of optimization may design a partial circuit in accordance with each integrated circuit. In this case, since external conditions of a partial circuit in each integrated circuit are estimated based on the technology information of the integrated circuit in the step of external condition estimation and each partial circuit is designed based on each external condition and on design indices of each integrated circuit in the step of optimization, it becomes possible to easily design a partial circuit which is optimal in accordance with respective integrated circuits.

In addition, in the present invention, the step of optimization uses a simulation circuit wherein a circuit expressing the external conditions estimated by the step of external condition estimation is connected to an external terminal of a partial circuit and designs the partial circuit based on the given design indices while evaluating the performance of the simulation circuit. In this manner, a partial circuit is designed based on the design indices and, therefore, it becomes possible to design a partial circuit which is optimal in accordance with the design indices.

In addition, two, or more, design indices may be given to the step of optimization so that a partial circuit may be designed in accordance with each design index based on each design index. In this case, since the partial circuit is designed based on two, or more, design indices, it becomes possible to design a partial circuit which is optimal in accordance with respective design indices.

In addition, in the present invention, the step of evaluation which evaluates the performance of a partial circuit, which has been designed in the step of optimization by using a circuit for evaluation, may be provided. In this case, an evaluation of the designed partial circuit can be easily carried out by, only, replacing the designed partial circuit with a partial circuit of the circuit for evaluation.

In addition, in the step of optimization, two, or more, design indices are given so as to provide the step of evaluation for evaluating the performance of the two, or more, designed partial circuits by using the circuit for evaluation at the time of designing the partial circuit in accordance with each design index based on the design index and the step of selection which selects a partial circuit based on the evaluation result of the step of evaluation. In this case, the designed partial circuit is replaced with a partial circuit of a circuit for evaluation so as to be evaluated and an optimal partial circuit can be easily selected.

In addition, in the present invention, partial circuits are circuits such as library cells or IPs.

In addition, in the present invention, partial circuits may be library cells and the external conditions may include at least one of the power source voltage of the library cells, the input signal waveform, the input drive resistance, the input current and the output load capacitance.

In addition, in the present invention, partial circuits may be circuits of two types, or more.

DESCRIPTION OF PREFERRED MODE

Figure 1:
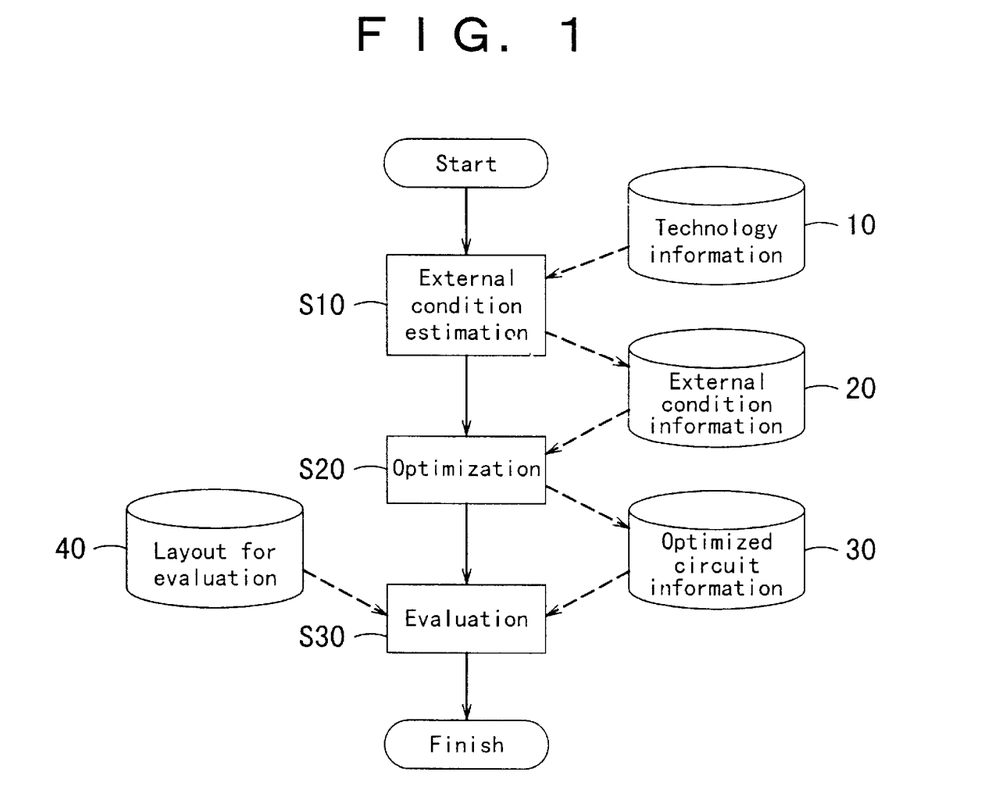
FIG. 1 is a diagram showing a process procedure of a method for design of a library cell according to the mode of the present invention.

The mode of the present invention is described in reference to the figures. Here, an example of a method for the design of a library cell, which forms a library, is described. FIG. 1 shows a process procedure of a method for design of a library cell according to the mode of the present invention.

In Step S10 of the external condition estimation, the external conditions of a library cell are estimated from the technology information 10, such as the wire width or the contact size, so as to generate external condition information 20.

Figure 2:
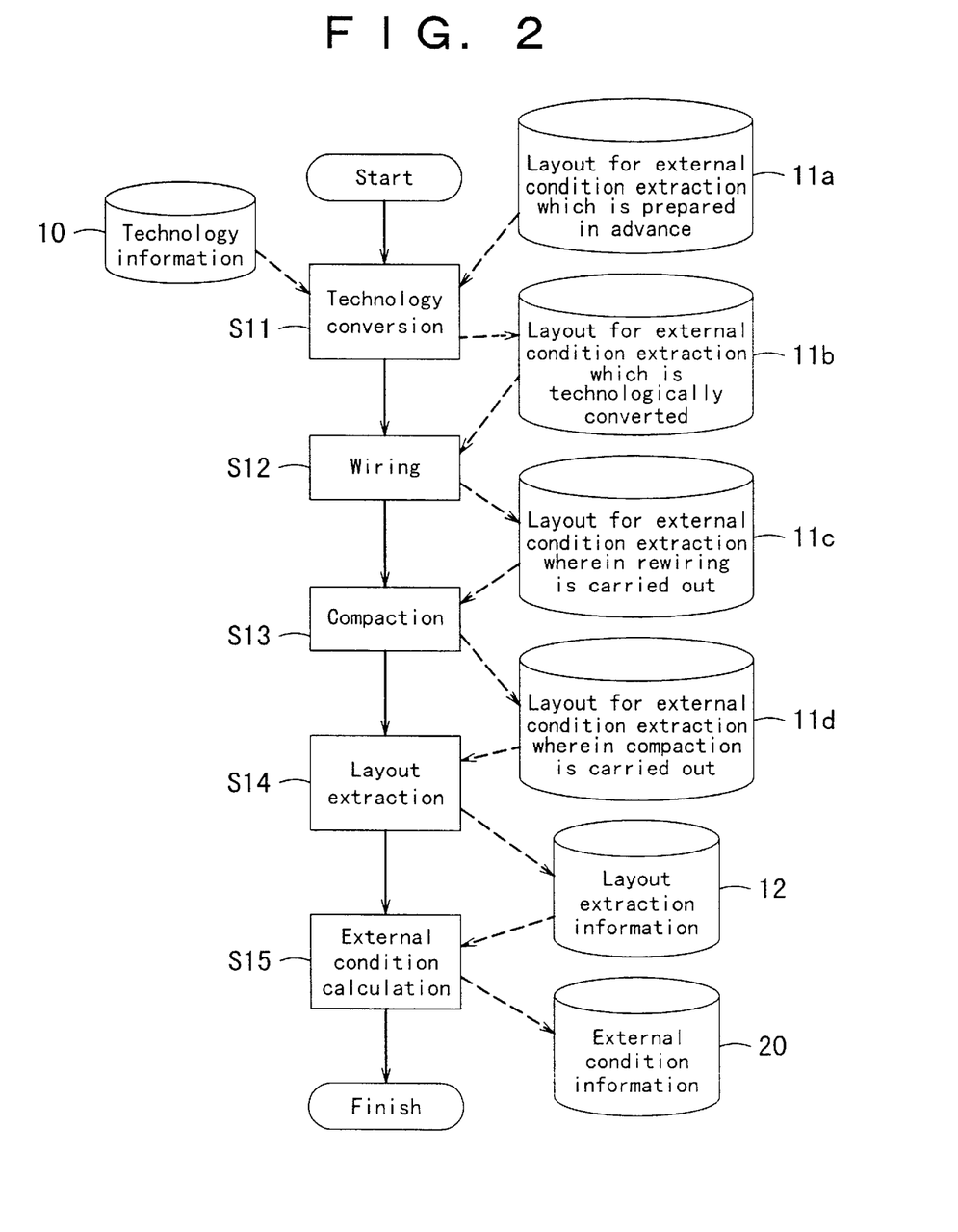
FIG. 2 is a diagram showing a process procedure of the step of external condition estimation according the mode of the present invention.

FIG. 2 is a diagram showing an example of a concrete process procedure of Step S10 of the external condition estimation in FIG. 1.

Figure 3:
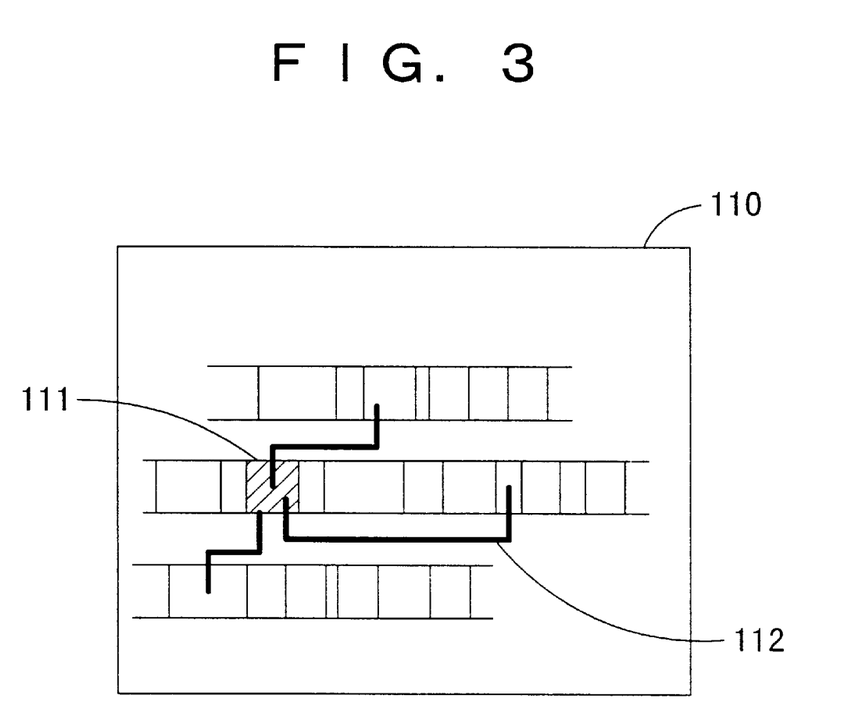
FIG. 3 is a diagram showing a layout for external condition estimation according to the mode of the present invention.

The technology information 10 is information showing the values of the design rule of an integrated circuit which in the process of being designed at the present time, of the characteristic parameter, and of the like, which has, for example, items as follows:

wire width wire film thickness wire gap number of wiring layers interlayer film thickness between wires minimum transistor size contact size wire capacitance per unit area wire resistance per unit length capacitance between wires per unit length FIG. 3 shows an example of a layout 11a for external condition extraction which has been prepared in advance in FIG. 2. In FIG. 3, a layout diagram of the layout 11a for external condition extraction is denoted as 110, one library cell, which is the design objective, is denoted as 111 and a wire between library cells is denoted as 112. The layout 11a for external condition extraction is an integrated circuit designed by using a library which is provided with this layout information. This layout 11a for external condition extraction is prepared in advance in order for the library cell designer(s) to extract the external conditions of a library cell, which is the design objective, and is stored in a memory, or the like, of the calculator. Then, this is extracted whenever a library cell of a new technology is designed, which is used for the extraction of the external conditions of the library cell in this technology.

As described above, the layout 11a for external condition extraction which has been prepared in advance includes one, or more, library cells, which are the design objectives, and includes layout information of the wires or the transistors connected to the library cells, which are the design objectives and, therefore, the external conditions of the library cells which reflect the layout can be precisely extracted. Though there may be only one layout for external condition extraction, as above, the greater is the number of circuits under external conditions which are close to actuality, the higher can be made the precision of the external conditions since the external conditions have dispersion due to types of circuits, which are the design objectives, such as a micro computer circuit, a data pass circuit or a memory peripheral circuit and due to the circuit scale, or the like. On the other hand, in the case of designing a library cell which targets the scale or the type of a particular circuit, a layout for external condition extraction in accordance with this target may be prepared.

Next, a process procedure of Step S10 of the external condition estimation is described in order based on FIG. 2.

First, in Step S11 of the technology conversion, the technology of the wire width, or the like, of the layout 11a for external condition extraction, which has been prepared in advance, is converted based on the technology information 10. Thereby, a layout 11b for external condition extraction, which has been technologically converted, that is to say, in the technology in the process of design at the present time, is gained. Here, in Step S11 of the technology conversion, the integrated circuit, itself, which is the design objective, may be used as the layout 11a for external condition extraction and, in this case, it becomes possible to gain external conditions (external condition information 20) which are closer to actuality in the below described Step S15 of the external condition calculation.

Next, in Step S12 of the wiring, rewiring of the layout 11b for external condition extraction, which has been technologically converted is carried out. This Step S12 of wiring is carried out based on the technology information 10, such as the number of wiring layers, the wire gap and the wire width in the objective technology and can be carried out by using a commercially available wiring tool. Conventionally at the time of process change, such as the change of the design rule, the change of the number of wiring layers, or the like, it is difficult to predict the change of the wire length due to the change of the number of the wiring layers utilized by the library cell. This Step S12, however, allows the wire length of the layout 11c for external condition extraction to be closer to the actual value so that the estimation precision of the wire capacitance or the wire resistance can be raised.

Next, in Step S13 of compaction, a compaction of the layout 11c for external condition extraction, wherein rewiring is carried out, is carried out. This Step S13 of compaction can be carried out by using a commercially available layout tool, or the like. This Step S13 allows the wire length of the layout 11d for external condition extraction to be closer to the actual value so that the estimation precision of the wire capacitance and the wire resistance can be raised.

Figure 4:
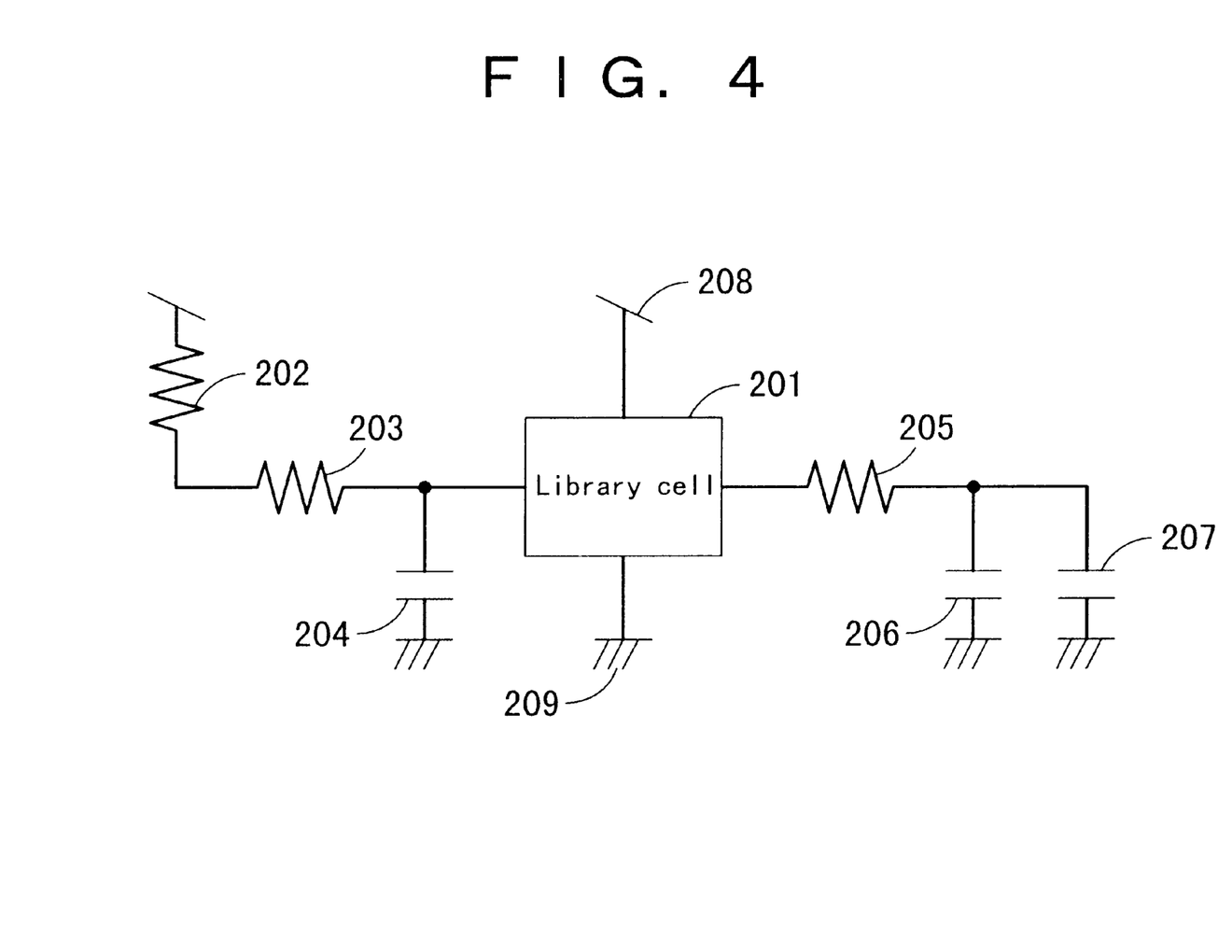
FIG. 4 is a diagram showing an example of the external conditions of a library cell according the mode of the present invention.
Figure 5:
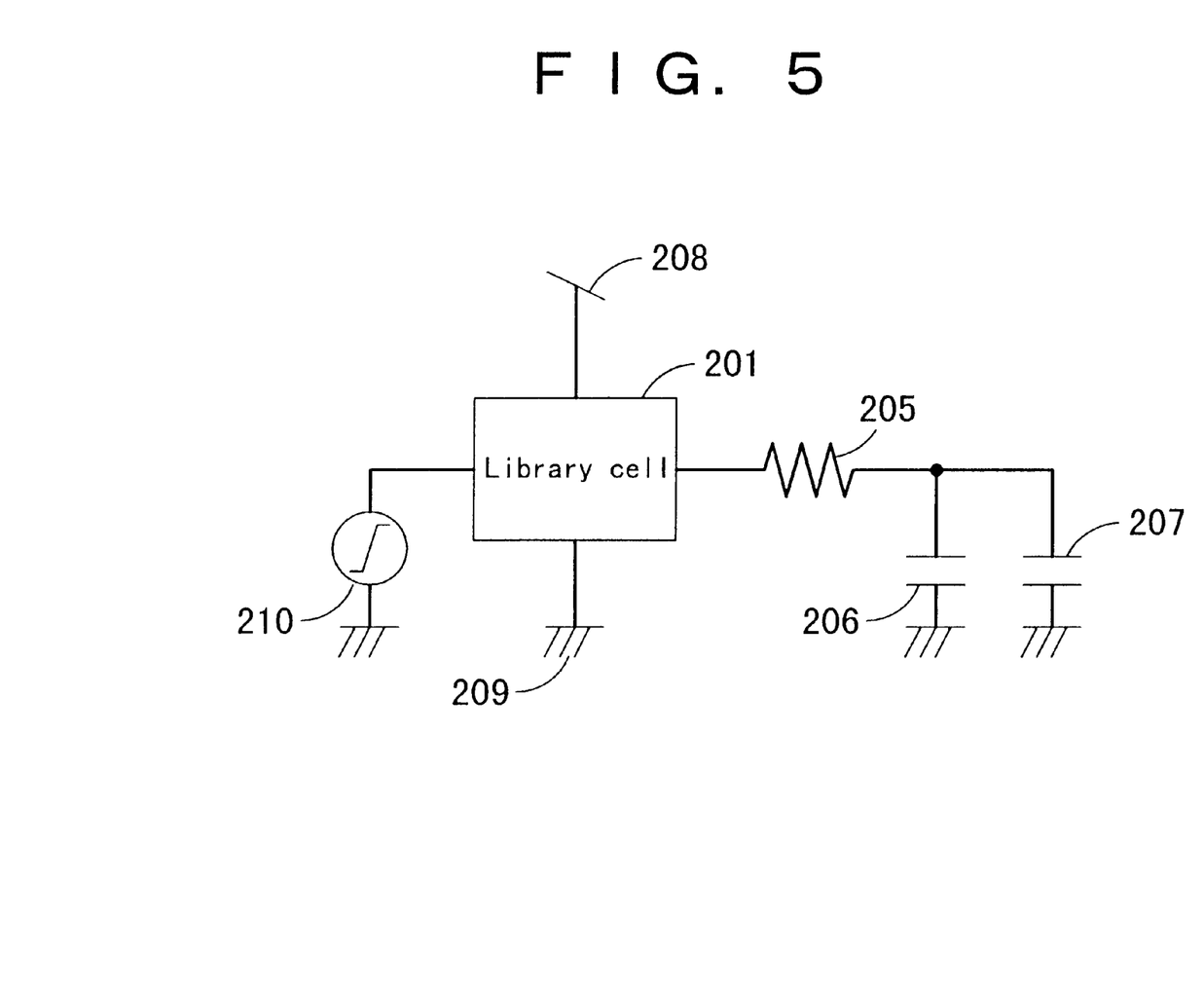
FIG. 5 is a diagram showing an example of the external conditions of a library cell according the mode of the present invention.

Next, in Step S14 of layout extraction, the extraction of layout extraction information 12 from the layout 11d for external condition extraction, wherein compaction is carried out, is carried out. The layout extraction information 12 represents information such as resistance or load capacitance of the outside of the cell which influences the operation of individual library cells. FIGS. 4 and 5 are, respectively, diagrams showing an example of the external conditions of a library cell. In FIG. 4, a library cell, which is the design objective, is denoted as 201, an input drive resistance is denoted as 202, an input wire resistance is denoted as 203, an input wire capacitance is denoted as 204, an output wire resistance is denoted as 205, an output wire capacitance load is denoted as 206, an output gate capacitance load is denoted as 207, a power source voltage is denoted as 208 and a ground voltage is denoted as 209. In FIG. 5, a voltage source representing an input signal waveform is denoted as 210 and the same numerals are attached to the other parts that correspond to the parts in FIG. 4. The layout extraction information 12 extracts resistances and load capacitances of the transistors, wires, or the like, by using a commercially available extraction tool and gains resistances and capacitances of the connected wires, transistors, or the like, for each library cell. In addition, the voltage source representing the power source voltage, the ground voltage and an input signal waveform can be extracted by using a commercially available simulation tool, or the like, in Step S15 of the external condition calculation and by calculating the power source voltage, the ground voltage and the input signal waveform of each library cell.

Here, the layout 11a for external condition extraction, which has been prepared in advance, changes to the layouts 11b, 11c and 11d for external condition extraction by carrying out respective Steps S11, S12 and S13.

In addition, Step S12 of wiring and Step S13 of compaction may be, respectively, omitted. In the case that Step S12 of wiring, only, is omitted, in Step S13 of compaction, the compaction of the layout 11b for external condition extraction, which has been gained in Step S11 of the technology conversion is carried out. In addition, in the case that Step S13 of compaction, only, is omitted, in Step S14 of layout extraction, the extraction of the layout extraction information 12 from the layout 11c for external condition extraction, which has been gained in Step S12 of wiring, is carried out. In addition, in the case that both the steps of Step S12 of wiring and Step S13 of compaction are omitted, in Step S14 of layout extraction, the extraction of the layout extraction information 12 from the layout 11b for external condition extraction, which has been gained in Step S11 of the technology conversion, is carried out.

Then, finally, in Step S15 of the external condition calculation, the external condition information 20 is found from the layout extraction information 12 through calculation. The external conditions of a library cell have the power source voltage of the library cell, the output load capacitance, the input drive resistance, the input signal waveform and the input current and at least one of these is included in the external condition information 20. As for the power source voltage of a library cell, the power source voltage supplied to each library cell changes due to the difference in the operational frequency, the external power source voltage, the power source wire width, the wire resistance, and the like. As for the output load capacitance, the capacitance to be loaded into each library cell changes due to the change of technology, such as the wire width, the wire gap, the wire film thickness and the film thickness between wiring layers or the change of the wire length. As for the input drive resistance, the input signal waveform and the input current, the input signal waveform or the input current, or the like, change due to the change of the capacitance or the resistance of the wire connected to the input terminal of the library cell or due to the change of the characteristics of the transistor which drives that wire.

Accordingly, the performance of library cells can be increased by extracting the above described external conditions which are close to the actual operation conditions in the objective circuit so as to be reflected at the time of the design of the library cells.

In addition, the calculation method of the external conditions has the following two types of methods.

(1) A method for finding the same external conditions for all of the library cells, which calculates the average value or the worst value of the capacitance value, the resistance value, or the like, of the entire net so as to be used as the external conditions.

(2) A method for finding the same external conditions for the same types of library cells, which calculates the average value or the worst value of the capacitance value, the resistance value, or the like, connected to each of the same types of library cells so as to be used as the external conditions of those library cells. Here, as for the types, there are types of logics such as an AND circuit, a NAND circuit and an inverter circuit or types of performances such as different circuit structures or different sizes of transistors even in the same logic types.

Method (1) has the advantages over method (2) as follows:
the process procedure is simple
implementation is possible even if all of the library cells are not included in the circuit for extraction (which indicates input data in the layout extraction Step S14 and is the layout 11d for external condition extraction in the example of FIG. 2 and which becomes a layout for external condition extraction gained by carrying out compaction on the technologically converted layout 11b for external condition extraction in the case that the wiring Step S12 is omitted, becomes the layout 11c for external condition extraction in the case that the compaction Step S13 is omitted and becomes the layout 11b for external condition extraction in the case that the compaction Step S13 and the wiring Step S12 are omitted.)

On the other hand, method (2) has the advantage over method (1) as follows:
biases of the external conditions for each library cell can be reflected
for example, the following are the biases of the external conditions:
differences of the external conditions between library cells which have high driving performance and library cells which have low driving performance
differences of the driving power between the clock signal and other signals
differences of the driving power between the control signal and the data signal.

Next, in the optimization Step S20 of FIG. 1, the optimization design of library cells is carried out based on the external condition information 20 so as to generate the optimized circuit information 30. This design for optimization can be carried out on the circuit (simulation circuit), as shown in FIG. 4, which makes use of the value of the external condition information 20 by using a method disclosed in, for example, reference A (Japanese patent 2872990). In this method of optimization in reference A, the delay value calculated in the simulation circuit (the value of external condition information 20 is used for values of the capacitance, the resistance, or the like, within the circuit) of FIG. 4 is used at the time of carrying out a delay evaluation of the library cells in the process of the optimization. An optimal library cell differs in accordance with the value of the above described external condition information 20. For example, the delay can be made smaller in the case that the output driving performance of the library cells is designed so as to become greater when the output wire capacitance load 206 and the output gate capacitance load 207 become larger and in the case that the input capacitance of the library cells are designed so as to become smaller when the input wire resistance 203 and the input wire capacitance 204 become larger.

Here, in the case of redesign for different design indices of the same technology, the same external condition information 20 may be used.

In addition, in this optimization Step S20, a desired optimized circuit (optimized circuit information 30) can be gained by giving a variety of design indices as shown, for example, in the following in accordance with the design strategy.
minimization in delay only
minimization of the area after satisfying the designated delay constraints
minimization of the delay after satisfying the designated area constraints
minimization of the delay after satisfying the designated power consumption constraints
minimization of the area after satisfying the designated power consumption constraints
minimization of delay×area
minimization of the cost function represented as aD+bA+ cP wherein the delay, the area and the power consumption are denoted, respectively, as D, A and P and proportional constants are denoted as a, b and c.

This optimized circuit (optimized circuit information 30) may be one type of library cell or may be a set of a plurality of types of library cells, that is to say, a library.

The delay, the area and the power consumption are actually, however, in a trade off relationship and, therefore, it is difficult to determine at this stage which strategy should be used for the design of the actual integrated circuit at the design stage of the library cells.

Therefore, in the evaluation Step S30, the optimized circuit information 30 is evaluated by using the layout 40 for evaluation (circuit for evaluation) so that the performance of the optimally designed library cells can be easily confirmed. To this end, input data (layout 11*d* for external condition extraction in the case of FIG. 2) in the layout extraction Step S14 is used, for example, as the layout 40 for evaluation and the optimized circuit information 30 is applied so that simulations, such as for delay for power consumption, or the like, may be carried out by using a commercially available tool, or the like. In addition, at this time, the library cell of the best performance can be selected (selection step) based on different external conditions of the library cells or different design indices or by carrying out the performance comparison of the library cells in the case that a plurality of library cells are optimally designed according to different designers or design methods.

Here, in the case that the optimized circuit is a set of a plurality of types of library cells, as for the evaluation of the optimized circuit information 30, not only the evaluation of the performance of the individual library cells but also the evaluation of the performance of a combination of a plurality of types of library cells can be carried out and by carrying out the performance comparison of the combinations of the library cells, the combination of the library cells of the best performance can be selected (selection step).

In addition, in the external condition estimation Step S10, external conditions in accordance with two, or more, integrated circuits, which are design objectives, are estimated so that, in the optimization Step S20, a library cell in accordance with each integrated circuit can be designed. In this case, the external conditions of library cells of each integrated circuit are estimated based on the technology information of each integrated circuit in the external condition estimation Step S10 and each library cell is designed based on the respective external conditions and the design indices of each integrated circuit in the optimization Step S20 and, thereby, it becomes possible to easily design optimal library cells in accordance with respective integrated circuits.

Though here, in the above described mode, a design method of library cells is described as an example, the present invention can be applied in the same manner to the case where a partial circuit, such as an IP, is designed. In the case of the application to the design of an IP, an IP which is optimized under other external conditions can be changed to an IP which is optimal for a desired technology by using a simulation circuit and, in addition, a simulation circuit which is considered to be close to the actual circuit can be used at a stage where external conditions are not known so that a partial circuit IP can be optimally designed. In this case, the layout 11*a* for external condition extraction is prepared in advance in order for the IP designers to extract the external conditions of the IP, which is the design objective, and is stored in a memory, or the like, of the calculator. Then, it is taken out whenever an IP for a new technology is designed so as to be used for the extraction of the external conditions of the IP in that technology. Here, in the case of redesign for different design indices in the same technology, the same external condition information 20 may be used.

What is claimed is:

1. A method for the design of a partial circuit for designing a partial circuit of an integrated circuit characterized by including:

the step of external condition estimation for estimating external conditions of said partial circuit when used in said integrated circuit; and the step of optimization for designing said partial circuit in accordance with said external conditions.

2. A method for the design of a partial circuit according to claim 1, wherein the step of external condition estimation estimates external conditions of the partial circuit based on technology information of an integrated circuit, which is the design objective.

3. A method for the design of a partial circuit according to claim 2, wherein the step of optimization uses a simulation circuit, where a circuit representing external conditions, estimated in the step of external condition estimation, is connected to an external terminal of a partial circuit, and designs the partial circuit based on given design indices while evaluating the performance of said simulation circuit.

4. A method for the design of a partial circuit according to claim 1, wherein the step of external condition estimation includes:

the step of technological conversion which technologically converts a layout for external condition extraction which has been prepared in advance based on technology information of an integrated circuit, which is the design objective;

the step of layout extraction for extracting layout extraction information, which is external information influencing the operation of said partial circuit, from said layout for external condition extraction, which has been technologically converted; and the step of external condition calculation for calculating, from layout extraction information, external conditions of said partial circuit.

5. A method for the design of a partial circuit according to claim 4, wherein the layout for external condition extraction, which has been prepared in advance, includes one, or more, partial circuits, which are the design objective, and comprises arrangement information and wiring information of said partial circuit.

6. A method for the design of a partial circuit according to claim 4, wherein the technology information of an integrated circuit, which is the design objective, includes one piece, or more, of information of wire width, minimum size of transistors and gap between wires.

7. A method for the design of a partial circuit according to claim 4, which is provided with the step of wiring for carrying out rewiring based on the technology information of an integrated circuit, which is the design objective, on the layout for external condition extraction which has been technologically converted in the step of technology conversion, wherein the step of layout extraction extracts layout extraction information from said layout for external condition extraction in which rewiring is carried out in said step of wiring.

8. A method for the design of a partial circuit according to claim 4, which is provided with the step of compaction for carrying out compaction on the layout for external condition extraction technologically converted in the technology conversion step wherein the step of layout extraction extracts layout extraction information from said layout for external condition extraction where compaction is carried out in said step of compaction.

9. A method for the design of a partial circuit according to claim 4, wherein the step of wiring for carrying out rewiring on the layout for external condition extraction, which has been technologically converted in the step of technology conversion based on technology information of an integrated circuit, which is the design objective, is provided and the step of compaction which carries out compaction on the layout for said external condition extraction, where rewiring is carried out in said step of wiring, is provided and the step of layout extraction extracts layout extraction information from said layout for external condition extraction where compaction has been carried out in said compaction step.

10. A method for the design of a partial circuit according to claim 1, wherein the step of external condition estimation estimates external conditions in accordance with two, or more, integrated circuits which are design objectives and the step of optimization designs a partial circuit in accordance with each of the integrated circuits.

11. A method for the design of a partial circuit according to claim 1, wherein the step of external condition estimation estimates different external conditions for two, or more, partial circuits and the step of optimization designs each of said partial circuits under different external conditions in accordance with each of the partial circuits.

12. A method for the design of a partial circuit according to claim 1, wherein the step of optimization uses a simulation circuit, where a circuit representing external conditions, estimated in the step of external condition estimation, is connected to an external terminal of a partial circuit, and designs the partial circuit based on given design indices while evaluating the performance of said simulation circuit.

13. A method for the design of a partial circuit according to claim 12, wherein in the step of optimization two, or more, design indices are given and a partial circuit is designed in accordance with each design index based on the design index.

14. A method for the design of a partial circuit according to claim 13, wherein the step of evaluation where the performance of two, or more, partial circuits designed in the step of optimization are evaluated by using a circuit for evaluation and the step of selection for selecting a partial circuit based on the evaluation result of said step of evaluation are provided.

15. A method for the design of a partial circuit according to claim 1, wherein the step of evaluation is provided where the performance of a partial circuit designed in the step of optimization is evaluated by using a circuit for evaluation.

16. A method for the design of a partial circuit according to claim 1, wherein the partial circuit is a library cell.

17. A method for the design of a partial circuit according to claim 1, wherein the partial circuit is a library cell and the external conditions include, at least, one of power source voltage, input signal waveform, input drive resistance, input current and output load capacitance of said library.

18. A method for the design of a partial circuit according to claim 1, wherein the partial circuit consists of two, or more, types of circuits.

* * * * *